US012631591B2

(12) United States Patent
Nakazumi

(10) Patent No.: US 12,631,591 B2
(45) Date of Patent: May 19, 2026

(54) SEMICONDUCTOR DEVICE, ELECTRONIC DEVICE, PH SENSOR, BIOSENSOR, METHOD FOR MANUFACTURING SEMICONDUCTOR DEVICE, AND METHOD FOR MANUFACTURING ELECTRONIC DEVICE

(71) Applicant: NIKON CORPORATION, Tokyo (JP)

(72) Inventor: Makoto Nakazumi, Yamato (JP)

(73) Assignee: NIKON CORPORATION, Tokyo (JP)

( * ) Notice: Subject to any disclaimer, the term of this patent is extended or adjusted under 35 U.S.C. 154(b) by 378 days.

(21) Appl. No.: 18/516,083

(22) Filed: Nov. 21, 2023

(65) Prior Publication Data

US 2024/0201125 A1 Jun. 20, 2024

Related U.S. Application Data

(63) Continuation of application No. PCT/JP2022/019691, filed on May 9, 2022.

(30) Foreign Application Priority Data

May 26, 2021 (JP) ................................. 2021-088679

(51) Int. Cl.
| | |
|---|---|
| *G01N 27/414* | (2006.01) |
| *H10D 30/01* | (2025.01) |
| *H10D 30/67* | (2025.01) |

(52) U.S. Cl.
CPC ..... *G01N 27/4145* (2013.01); *G01N 27/4146* (2013.01); *H10D 30/0321* (2025.01); *H10D 30/6729* (2025.01); *H10D 30/6755* (2025.01)

(58) Field of Classification Search
CPC ........... G01N 27/4145; H10D 30/0321; H10D 30/6755
USPC ......................................................... 257/253
See application file for complete search history.

(56) References Cited

U.S. PATENT DOCUMENTS

| | | | |
|---|---|---|---|
| 8,685,803 B2 | 4/2014 | Chikama et al. | |
| 2012/0241750 A1* | 9/2012 | Chikama .............. | H10D 86/441 |
| | | | 438/151 |
| 2019/0181268 A1* | 6/2019 | Nakazumi .......... | G01N 27/4145 |
| 2022/0034837 A1* | 2/2022 | Nakazumi .......... | G01N 27/4167 |

FOREIGN PATENT DOCUMENTS

| | | |
|---|---|---|
| JP | 2013-51421 A | 3/2013 |
| JP | 2016-519443 A | 6/2016 |
| JP | 2016-189461 A | 11/2016 |
| WO | 2018/025647 A1 | 2/2018 |
| WO | 2020/174540 A1 | 9/2020 |

OTHER PUBLICATIONS

International Search Report dated Jul. 26, 2022 for international Application No. PCT/JP2022/019691.
Korean Office Action dated Sep. 27, 2024 for Korean Application No. 10-2023-7039432.

* cited by examiner

*Primary Examiner* — Xia L Cross

(57) ABSTRACT

A semiconductor device includes a first electrode, a second electrode, and a semiconductor layer in contact with the first electrode and the second electrode. The semiconductor layer includes a first oxide layer of 5 to 20 nm containing spinel-type $ZnGa_2O_4$, and a second oxide layer of 5 to 50 nm containing In, Ga, and Zn.

10 Claims, 10 Drawing Sheets

<FIRST EXAMPLE>

Spinel ZnGa2O4(10nm) /
IGZO(15nm)

SEMICONDUCTOR DEVICE, ELECTRONIC DEVICE, PH SENSOR, BIOSENSOR, METHOD FOR MANUFACTURING SEMICONDUCTOR DEVICE, AND METHOD FOR MANUFACTURING ELECTRONIC DEVICE

CROSS REFERENCE TO RELATED APPLICATIONS

This application is a continuation application, filed under 35 U.S.C. § 111(a), of International Application No. PCT/JP2022/019691, filed May 9, 2022, which claims priority benefit from Japanese Patent Application No. 2021-088679, filed May 26, 2021, the contents of each of which are incorporated herein by reference.

TECHNICAL FIELD

The present invention relates to a semiconductor device, an electronic device, a pH sensor, a biosensor, a method for manufacturing a semiconductor device, and a method for manufacturing an electronic device. The present invention claims priority to Japanese Patent Application No. 2021-088679, filed on May 26, 2021, the contents of which are incorporated by reference herein in its entirety in designated states where the incorporation of documents by reference is approved.

BACKGROUND ART

For example, an amorphous oxide such as an oxide constituted by In, Ga, and Zn (IGZO; In—Ga—Zn—O) is used as a semiconductor material used for a semiconductor device such as a thin film transistor (TFT) (see PTL 1). Such a conventional semiconductor material has insufficient chemical durability, and thus when a semiconductor device is manufactured, a process such as an etching step is performed by providing a structure for protecting the semiconductor material from chemical damage.

PTL 1: JP 2013-051421 A

SUMMARY

According to a first aspect of the present invention, a semiconductor device includes a first electrode, a second electrode, and a semiconductor layer in contact with the first electrode and the second electrode. The semiconductor layer includes a first oxide layer of 5 to 20 nm containing spinel-type $ZnGa_2O_4$, and a second oxide layer of 5 to 50 nm containing In, Ga, and Zn.

A second aspect of the present invention provides an electronic device including the semiconductor device according to the first aspect.

A third aspect of the present invention provides a pH sensor including the semiconductor device according to the first aspect.

A fourth aspect of the present invention provides a biosensor including the semiconductor device according to the first aspect.

A fifth aspect of the present invention provides a method for manufacturing a semiconductor device, the method including forming a semiconductor layer, forming a conductive layer on the semiconductor layer, and etching the conductive layer corresponding to a certain pattern to form the first electrode and the second electrode.

A sixth aspect of the present invention provides a method for manufacturing an electronic device, the method including forming a semiconductor device by using the method for manufacturing a semiconductor device according to the fifth aspect.

DETAILED DESCRIPTION

Figure 1:
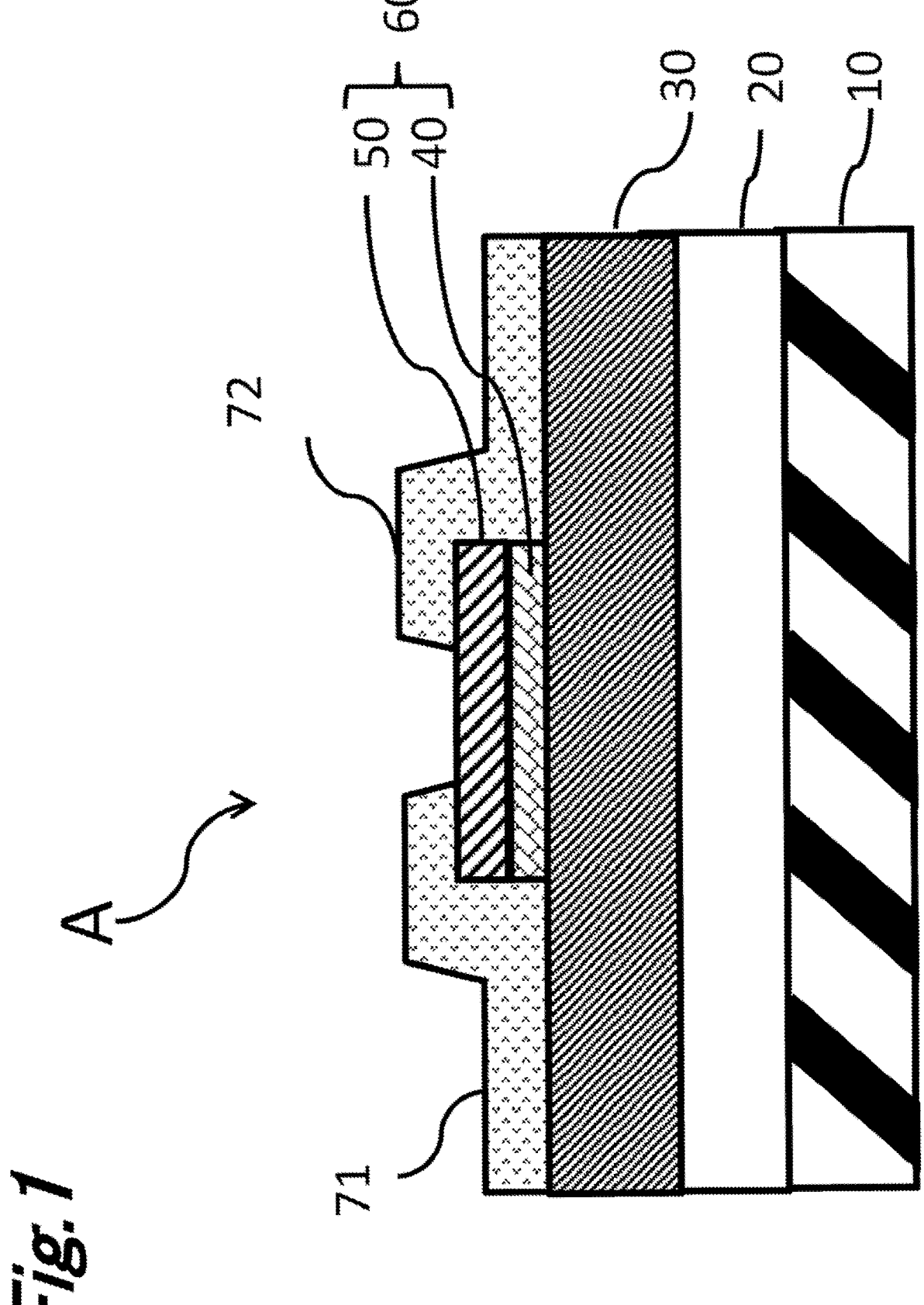
FIG. 1 is a schematic diagram of a semiconductor device A according to a first embodiment.

An embodiment of the present invention (hereinafter, simply referred to as the "present embodiment") will be described below in detail. The present embodiment described below is an example for describing the present invention, and is not intended to limit the present invention to the contents described below. Note that, in the drawings, a positional relationship between up, down, left, right, and the like are based on a positional relationship illustrated in the drawings unless otherwise specified.

Furthermore, a dimension ratio in the drawings is not limited to an illustrated ratio.

FIG. 1 is a schematic diagram of a semiconductor device A according to a first embodiment.

Figure 2:
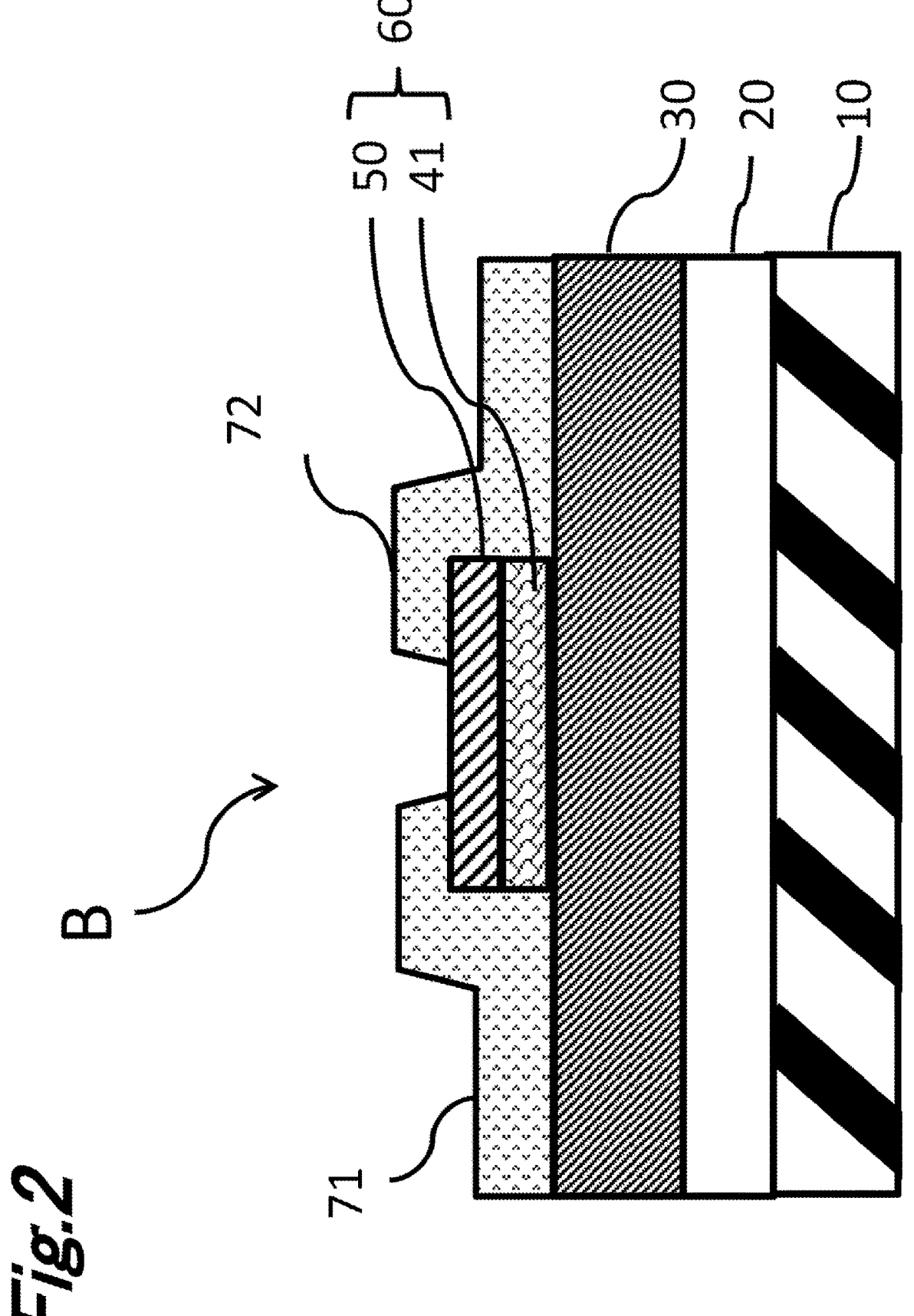
FIG. 2 is a schematic diagram of a semiconductor device B according to a second embodiment.

FIG. 2 is a schematic diagram of a semiconductor device B according to a second embodiment.

The semiconductor device A according to the first embodiment is a bottom-gate top-contact (BGTC) semiconductor device. The semiconductor device A includes a first electrode 71, a second electrode 72, and a semiconductor layer 60 in contact with the first electrode and the second electrode. The semiconductor layer 60 includes a spinel-type $ZnGa_2O_4$ layer 50 (first oxide layer) and an IGZO layer 40 (second oxide layer). The first electrode 71 and the second electrode 72 are arranged on an insulating layer 30, and a part of each electrode covers the spinel-type $ZnGa_2O_4$ layer 50. The IGZO layer 40 is an inorganic semiconductor having an oxide containing In, Ga, and Zn.

The semiconductor device B according to the second embodiment is a bottom-gate top-contact (BGTC) semiconductor device. The semiconductor device B includes a first electrode 71, a second electrode 72, and a semiconductor layer 60 in contact with the first electrode and the second electrode. The semiconductor layer 60 includes a spinel-type $ZnGa_2O_4$ layer 50 (first oxide layer) and an IGZTO layer 41 (second oxide layer). The first electrode 71 and the second electrode 72 are arranged on an insulating layer 30, and a part of each electrode covers the spinel-type $ZnGa_2O_4$ layer 50. The IGZTO layer 41 is an inorganic semiconductor having an oxide containing In, Ga, Zn, and Sn.

The semiconductor devices A and B each includes a substrate 10, a third electrode 20 formed on the substrate 10, and the insulating layer 30 formed on the third electrode 20. The third electrode 20 is provided to face the semiconductor layer 60 via the insulating layer 30. The first electrode 71 is a source electrode, the second electrode 72 is a drain electrode, and the third electrode 20 is a gate electrode.

The semiconductor devices A and B each uses the spinel-type $ZnGa_2O_4$ layer 50, and thus there are advantages of a low film-formation temperature, a fast film-formation speed, and fewer impurity entries. In addition, there is also an advantage of being able to easily manufacture the semiconductor devices A and B even when a flexible substrate is used.

For example, a metal oxide film such as silicon oxide and aluminum oxide has been conventionally used as a protective layer (passivation layer) for a semiconductor layer for various purposes, but has many problems, such as a high film-formation temperature and a slow film-formation speed. For example, when the metal oxide film is formed by chemical vapor deposition (CVD), there are problems such as a high film-formation temperature, necessity of a large-scale CVD film-formation device, and introduction of a large amount of impurities including hydrogen and carbon derived from a material gas. Alternatively, when the metal oxide film is formed by a radio frequency (RF) sputtering method, problems are reduction in insulation and occurrence of optical absorption due to oxygen deficiency in the protective layer, for example.

In this regard, the semiconductor devices A and B can solve all the problems at once by using the spinel-type $ZnGa_2O_4$ layer 50 as the protective layer. The spinel-type $ZnGa_2O_4$ layer can be more relatively easily and efficiently film-formed than the above-mentioned metal oxide film and the like.

Furthermore, the spinel-type $ZnGa_2O_4$ layer 50 of each of the semiconductor devices A and B is highly stable with respect to an acid, a base, and the like while having a semiconductor property. Thus, the semiconductor devices A and B each also has an excellent semiconductor property while exhibiting a passivation effect that is as excellent as or more excellent than a conventional protective layer using a metal oxide film.

Using the spinel-type $ZnGa_2O_4$ layer 50 allows an electrode to be directly arranged on a semiconductor layer without an ESL (etch-stop layer) or the like intervening therebetween. When the ESL is used, it is necessary to provide the ESL with a hole connecting the electrode to the semiconductor layer, and, furthermore, it is necessary to perform a high-temperature heating process at 250 degree Celsius or more. Using the spinel-type $ZnGa_2O_4$ layer 50 eliminates the necessity of performing such a process. A structure of each of the semiconductor devices A and B will be described below.

A material of the substrate 10 is not particularly limited, and a known material can be adopted. Specific examples include glass, resin, silicon, metal, an alloy, and foil thereof. Particularly, one kind selected from the group consisting of glass, resin, silicon, and combinations of glass, resin, and silicon is preferable.

As resin, for example, a polyacrylate, a polycarbonate, a polyurethane, a polystyrene, a cellulose polymer, a polyolefin, a polyamide, a polyimide, a polyester, a polyphenylene, a polyethylene, a polyethylene terephthalate, a polypropylene, an ethylene-vinylalcohol copolymer, a polyvinyl chloride, and the like can be used.

A CVD method with a high film-formation temperature may not be used for formation of the spinel-type $ZnGa_2O_4$ layer 50. Thus, even when a resin material having a low heat-resistant temperature is used as the substrate 10, the spinel-type $ZnGa_2O_4$ layer 50 can be suitably film-formed.

The substrate 10 may have flexibility. When the substrate 10 is a film substrate (also referred to as a "sheet substrate" in some cases) having flexibility, a roll-to-roll method for continuously performing film formation with a roll-shaped film substrate and a roll-to-sheet method can be adopted, and increased efficiency, simplification, an improved yield, and the like of a manufacturing process can be expected.

The roll-to-roll method refers to a method for unwinding a roll-shaped film substrate, continuously performing film formation, and rewinding the film substrate into a roll shape. The roll-to-sheet method refers to a method for unwinding a roll-shaped film substrate, continuously performing film formation, and cutting the film substrate to form a sheet.

The third electrode 20 is a gate electrode. The third electrode 20 is not particularly limited, and a known gate electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like. A method for producing the third electrode 20 being a gate electrode is not particularly limited, and a suitable method can be appropriately adopted in consideration of materials of the substrate 10 and the gate electrode.

The third electrode 20 being a gate electrode may be conductive silicon, and may also serve as the substrate 10.

The insulating layer 30 is not particularly limited, and a known material can be adopted. Specific examples include, for example, an inorganic material such as $SiO_2$, $Si_3N_4$, SiON, $Al_2O_3$, $Ta_2O_5$, and $HfO_2$, a photo-curable resin, a thermosetting resin, and the like.

The semiconductor layer 60 is formed in contact with the first electrode 71 and the second electrode 72. The first electrode 71 and the second electrode 72 are arranged on the insulating layer 30, and a part of each electrode covers the spinel-type $ZnGa_2O_4$ layer 50 (first oxide layer). The semiconductor layer 60 includes the $ZnGa_2O_4$ layer 50 (first oxide layer) and an IGZO layer 40 or an IGZTO layer 41 (second oxide layer).

The IGZO layer 40 is an inorganic semiconductor having an oxide containing In, Ga, and Zn. The IGZTO layer 41 is an inorganic semiconductor having an oxide containing In, Ga, Zn, and Sn.

The IGZO layer 40 or the IGZTO layer 41 (second oxide layer) may be doped with a carrier element in terms of further improving a semiconductor property. The carrier element is not particularly limited, and a known carrier element can be adopted in a doping process. Specific examples include hydrogen, monovalent metal, bivalent metal, and trivalent metal. Particularly, in the present embodiments, the semiconductor layer 60 is more preferably doped with hydrogen.

A film thickness of the IGZO layer is 5 to 50 nm, is preferably 10 to 40 nm, and is more preferably 10 to 30 nm. A film thickness of the IGZTO layer is 5 to 50 nm, is preferably 10 to 40 nm, and is more preferably 10 to 30 nm.

$ZnGa_2O_4$ constituting the spinel-type $ZnGa_2O_4$ layer 50 (first oxide layer) crystallizes at a relatively low temperature. In the present embodiments, the spinel-type $ZnGa_2O_4$ can be hydrogen free. In other words, a protective layer that is not doped with hydrogen and a protective layer that does not substantially contain hydrogen can be suitably adopted. Herein, "not substantially contain" means that a corresponding component is not actively added, and does not exclude a situation where a corresponding component is inevitably contained or mixed.

The presence of excessive hydrogen in the spinel-type $ZnGa_2O_4$ layer 50 (first oxide layer) may cause a malfunction in which the hydrogen as an impurity also enters the semiconductor layer 60. For example, the presence of an impurity such as hydrogen spreads the impurity through a semiconductor, and a $V_{TH}$ (threshold voltage) shift amount increases. In this regard, for example, when a metal oxide film such as silicon oxide is used as a protective layer by a conventional method, the presence of excessive hydrogen in the protective layer due to use of hydrogen as a raw material of the metal oxide film may cause deterioration of the semiconductor layer 60, but hydrogen may not be used in the present embodiments. From such a viewpoint, a hydrogen content of the spinel-type $ZnGa_2O_4$ layer 50 (first oxide layer) is preferably equal to or less than $1\times10^{21}$ atm/cc, and is more preferably equal to or less than $1\times10^{18}$ atm/cc. The hydrogen content can be measured by secondary ion mass spectrometry (SIMS).

The spinel-type $ZnGa_2O_4$ layer 50 (first oxide layer) can also function as a passivation film. The passivation film shields the IGZO layer 40 or the IGZTO layer 41 (second oxide layer) from the outside environment, and can protect the IGZO layer 40 or the IGZTO layer 41 (second oxide layer) from moisture, a metal ion, and the like.

A film thickness of the spinel-type $ZnGa_2O_4$ layer 50 (first oxide layer) is 5 to 20 nm, is preferably 5 to 15 nm, and is more preferably 5 to 10 nm.

The first electrode 71 and the second electrode 72 are formed by forming a conductive layer 70 on the semiconductor layer 60 and by etching the conductive layer 70 corresponding to a certain pattern. For example, the first electrode 71 and the second electrode 72 are formed by a normal photolithography step.

When the first electrode 71 is used as a source electrode, the source electrode is not particularly limited, and a known source electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like.

When the second electrode 72 is used as a drain electrode, the drain electrode is not particularly limited, and a known drain electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like.

In the present embodiments, as in the semiconductor devices A and B, a transistor in which the first electrode 71, the second electrode 72, and the third electrode 20 are a source electrode, a drain electrode, and a gate electrode, respectively, may be formed. Thus, the semiconductor devices according to the present embodiments are not limited to the structures illustrated in FIGS. 1 and 2, and can adopt various structures.

The semiconductor devices A and B described above, of course, have an excellent semiconductor property such as electron conductivity, and can also provide chemical resistance such as acid resistance and base resistance by including the spinel-type $ZnGa_2O_4$ layer 50 (first oxide layer).

Therefore, the semiconductor devices according to the present embodiments can be suitably used for various sensors such as a pH sensor and a biosensor and also for an electronic device such as a TFT liquid crystal and an organic EL. Examples of these will be described below.

<pH Sensor>

Figure 3:
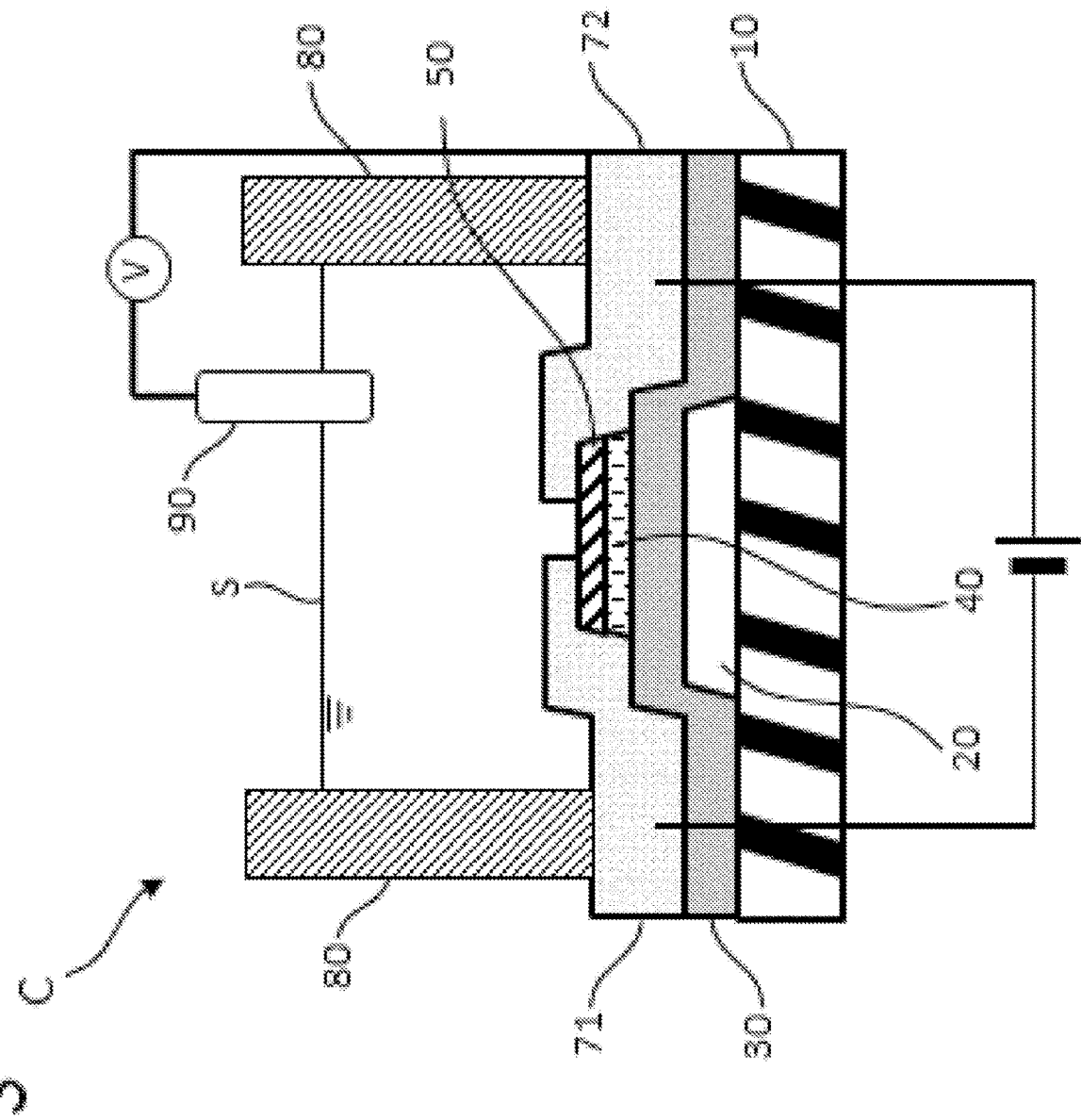
FIG. 3 is a schematic diagram of a pH sensor C including a semiconductor device according to the present embodiment.

FIG. 3 is a schematic diagram of a pH sensor C including the semiconductor device according to the present embodiment.

The pH sensor C is, for example, a pH sensor (ion sensitive-FET; ion sensitive field effect transistor) using the semiconductor device according to the present embodiment.

The pH sensor C includes the semiconductor device according to the present embodiment, and a pool wall 80 made of silicon rubber and a reference electrode 90 that are provided above the semiconductor device. A solution S to be measured (for example, hydrochloric acid in a case of an acid solution, a sodium hydroxide solution in a case of an alkali solution, or the like) fills in a pool constituted by the pool wall 80 to measure a potential difference from the reference electrode 90. Since pH in the solution S depends on a proton amount in the solution, a measurement principle of the pH sensor is to electrically measure the proton amount in the solution and calculate a pH value, based on the measured proton amount.

The semiconductor device according to the present embodiment can also provide high stability to a strong acid and a strong base. Thus, the pH sensor using the semiconductor device provides high stability in a wide pH region such as pH1 to pH14, and can perform quick and accurate measurement even when a target sample is a strong acid or a strong base.

<Biosensor>

Although not illustrated, the semiconductor devices according to the present embodiments can also be used as a biosensor (also referred to as a biosensor chip, in some cases). The biosensor is a chemical sensor using a molecular recognition mechanism of biological origin, and is used as a chemical recognition element of a pH change, an oxidation-reduction reaction, and the like in an organism.

In this regard, the semiconductor devices according to the present embodiments have high stability in a wide pH region, and can thus be a biosensor capable of performing accurate sensing even when a measurement target is a strong acid or a strong base. For example, the semiconductor devices can be a biosensor that causes a specific antibody to be modified on a semiconductor surface and measures a proton amount when a detection target such as DNA specific to the antibody is absorbed.

<Manufacturing Method>

Figure 4:
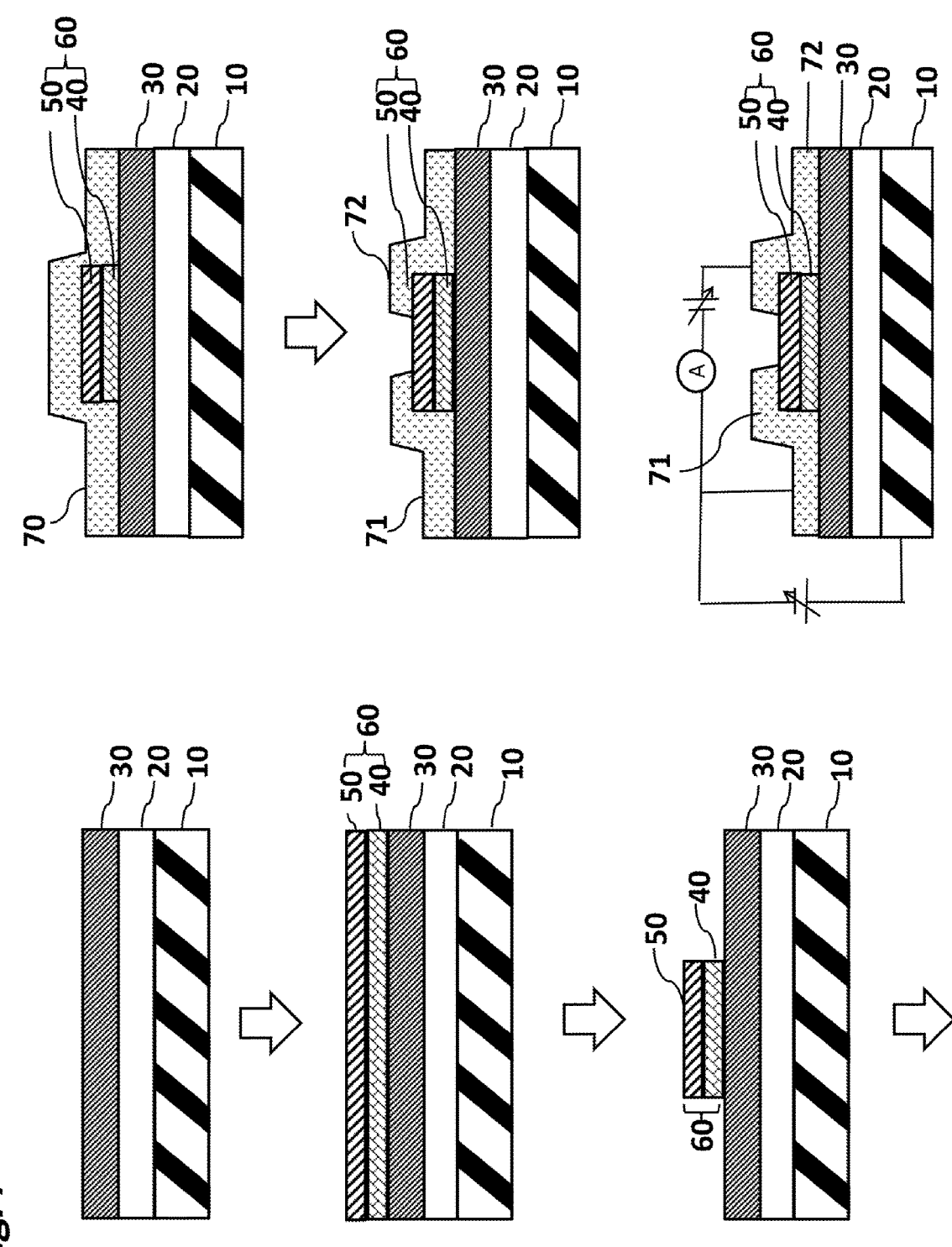
FIG. 4 is a diagram illustrating an example of a method for manufacturing the semiconductor device A according to the first embodiment.
Figure 5:
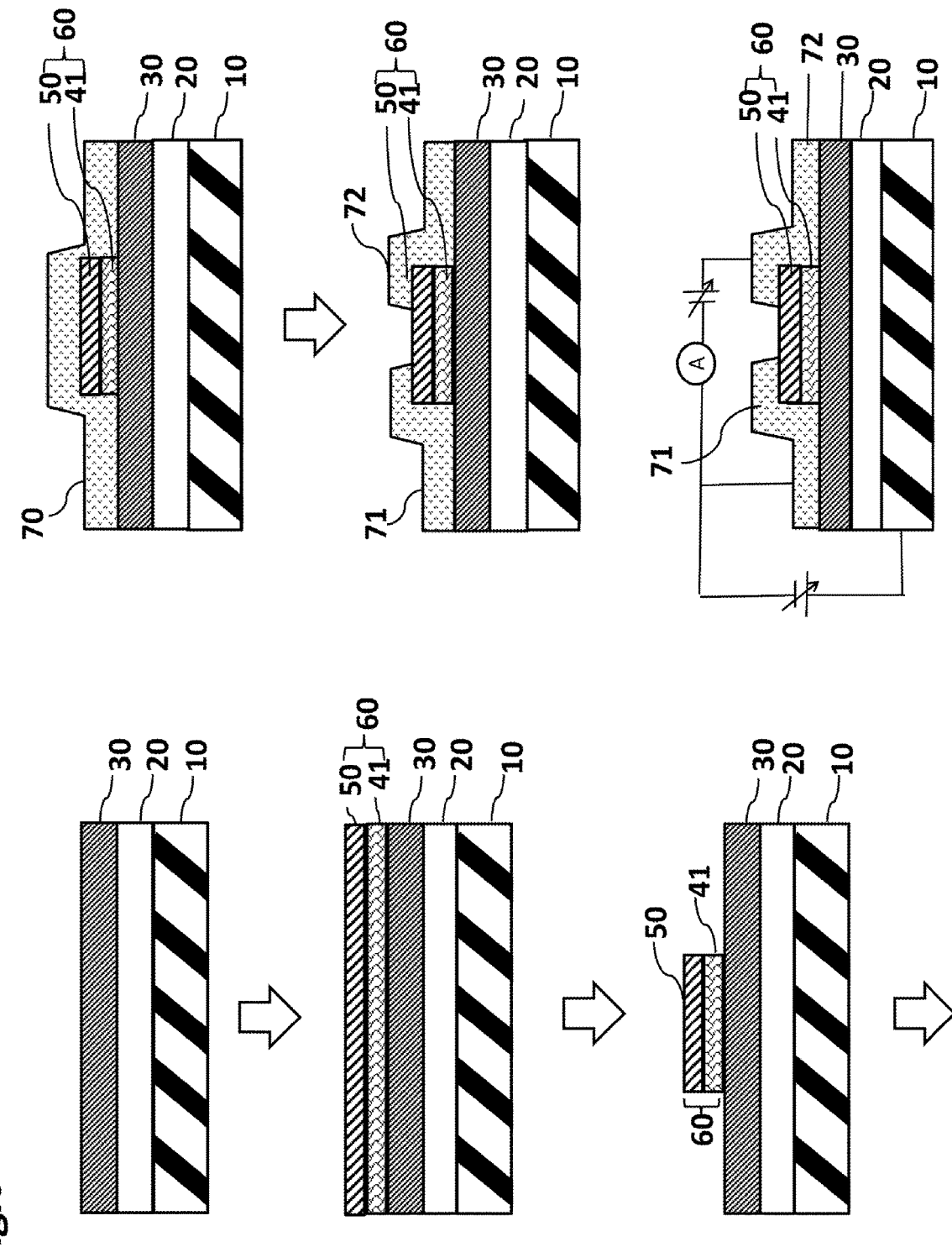
FIG. 5 is a diagram illustrating an example of a method for manufacturing the semiconductor device B according to the second embodiment.

FIG. 4 is a diagram illustrating an example of a method for manufacturing the semiconductor device A according to the first embodiment. FIG. 5 is a diagram illustrating an example of a method for manufacturing the semiconductor device B according to the second embodiment.

The manufacturing method illustrated in FIG. 4 is the method for manufacturing the bottom-gate top-contact semiconductor device A. This manufacturing method includes a step of forming, on the substrate 10, the semiconductor layer 60 including the spinel-type $ZnGa_2O_4$ layer 50 (first oxide layer) and the IGZO layer 40 (second oxide layer), a step of forming the conductive layer 70 on the substrate 10, and a step of forming the first electrode 71 and the second electrode 72 by etching the conductive layer 70 corresponding to a certain pattern.

The manufacturing method illustrated in FIG. 5 is the method for manufacturing the bottom-gate top-contact semiconductor device B, and includes the same steps as those of the above-described manufacturing method illustrated in FIG. 4, except that the IGZO layer 40 of the semiconductor device A replaced with the IGZTO layer 41.

Each step will be described below in detail.

First Step

First, the third electrode 20 is formed on a surface of the substrate 10. The third electrode 20 corresponds to the above-mentioned gate electrode. The method for forming the third electrode 20 on the surface of the substrate 10 is not particularly limited, and a suitable method can be appropriately adopted in consideration of materials and the like of the substrate 10 and the electrode.

Second Step

Next, the insulating layer 30 is formed on the surface of the substrate 10 on the side on which the third electrode 20 is formed, and the third electrode 20 is covered by the insulating layer 30. The method for forming the insulating layer 30 is not particularly limited, and a suitable method can be appropriately adopted in consideration of materials and the like of the substrate 10, the third electrode 20, and the insulating layer 30.

Third Step

Then, the semiconductor layer 60 is formed on a surface of the insulating layer 30. When the semiconductor device A is manufactured, the semiconductor layer 60 is formed by the spinel-type $ZnGa_2O_4$ layer 50 covering the IGZO layer 40. When the semiconductor device B is manufactured, the semiconductor layer 60 is formed by the spinel-type $ZnGa_2O_4$ layer 50 covering the IGZTO layer 41. The spinel-type $ZnGa_2O_4$ layer 50 allows the inside of each device to be protected from moisture, a metal ion, and the like from the outside.

Since it has been considered preferable to adopt a metal oxide film such as silicon oxide and aluminum oxide for a conventional protective layer (passivation layer), a film-formation temperature thereof has been required to be equal to or higher than 400 degree Celsius. However, in the manufacturing method according to the present embodiment, a film-formation temperature of the spinel-type $ZnGa_2O_4$ layer 50 to be used as a protective layer is a low temperature and a film-formation speed is also fast, and thus the semiconductor devices can be easily and efficiently manufactured. For example, when a resin substrate is used as the substrate 10, a usable temperature thereof is a relatively low temperature, and thus a film-formation temperature is preferably a low temperature. From such a viewpoint, a film-formation temperature of the spinel-type $ZnGa_2O_4$ layer 50 is 190 to 250 degree Celsius, and is preferably 190 to 210 degree Celsius.

Both of the layers constituting the semiconductor layer 60 are preferably formed by a sputtering method. In this case, the layers can be formed by using a sputtering device, and a plurality of cathodes may be used for the formation. For sputtering, single simultaneous sputtering targeted for a material of a single kind may be adopted, or co-sputtering targeted for materials of a plurality of kinds may be adopted. For example, when a target used in film-formation of the IGZO layer 40 or the IGZTO layer 41 is the same as a target used in the spinel-type $ZnGa_2O_4$ layer 50, a target in the sputtering method can be used in common, and thus film-formation can be performed continuously in the same device.

Film-formation of the IGZO layer 40 included in the semiconductor device A may use, as a target, an oxide sintered body being $InGaZnO_4$ (single simultaneous sputtering). With multiple simultaneous use of three kinds of $In_2O_3$, $Ga_2O_3$, and $ZnO$, control may be performed by tilting a composition ratio to obtain an IGZO layer having a desired composition (multiple simultaneous sputtering, co-sputtering).

Film-formation of the IGZTO layer 41 included in the semiconductor device B may use KOS-B02 (manufactured by Kobelco Research Institute Inc.) as a target (single simultaneous sputtering). With multiple simultaneous use of four kinds of $In_2O_3$, $Ga_2O_3$, $SnO_2$, and $ZnO$, control may be performed by tilting a composition ratio to obtain an IGZTO layer having a desired composition (multiple simultaneous sputtering, co-sputtering).

For example, in a case of an n-type semiconductor material, producing by element doping and oxygen deficiency in a film can be achieved. An element with which an n-type semiconductor can be obtained is not particularly limited, but examples of the element include Al, In, Sn, Sb, and Ta. A method for causing oxygen deficiency is not particularly limited, and a known method can be adopted. Specifically, heat treatment is preferably performed under an oxygen-vulnerable atmosphere or under a reducing gas atmosphere such as hydrogen and vapor. Examples include a method for performing film formation in a state in which hydrogen is mixed in a sputtering gas, and performing n-type carrier doping by interstitial hydrogen. The processing may be performed in a chamber after film formation, or firing may be performed as a post-step.

The spinel-type $ZnGa_2O_4$ layer 50 can be film-formed by performing co-sputtering by using a gallium zinc oxide and a zinc oxide as a target. Alternatively, a method for performing co-sputtering by using a gallium oxide and a zinc oxide as a target, or a method for performing co-sputtering by using gallium and zinc as a target and oxidizing gallium and zinc with a reactive gas during film formation may be used. Furthermore, the film formation is not limited to co-sputtering, a method for performing sputtering by using a mixture of a zinc oxide and a gallium oxide as a target and oxidizing the mixture with a reactive gas during film formation may be used.

Using the spinel-type $ZnGa_2O_4$ layer 50 allows the semiconductor layer 60 to exhibit high resistance to a strong acid and a strong base. Thus, a step of protecting a semiconductor layer or the like can be omitted for a manufacturing process.

In terms of improving film crystallinity, a film-formation temperature of the spinel-type $ZnGa_2O_4$ layer 50 has a lower limit of 190 degree Celsius or more, preferably has a lower limit of 200 degree Celsius or more, has an upper limit of 250 degree Celsius or less, and preferably has an upper limit of 210 degree Celsius or less. Note that excessive heating may cause evaporation of Zn particles flying to the surface of the substrate 10, and a deviation (composition deviation) from a stoichiometric mixture ratio between Ga and Zn may occur, but a Zn concentration in a film can be increased by simultaneously discharging a sintered body target including Zn or ZnO, and the composition deviation can be effectively prevented.

Fourth Step

A step of forming the first electrode 71 and the second electrode 72 is performed by forming the conductive layer 70 on the semiconductor layer 60 and by etching the conductive layer 70 corresponding to a certain pattern. The first electrode 71 is a source electrode, and the second electrode 72 is a drain electrode. As a method for forming the first and second electrodes, a normal photolithography step can be used. In this case, the conductive layer 70 is formed on the semiconductor layer 60, a resist layer is then formed on the conductive layer 70, and the resist layer is exposed and developed with certain pattern light. Next, the first electrode 71 and the second electrode 72 can be formed by etching the conductive layer exposed from an opening of the resist layer. Note that, as the resist layer, a positive material may be used or a negative material may be used.

In this case, an etching solution is preferably an acid solution. Since a resist material used in the normal photo-lithography step is often alkali-soluble, the conductive layer can be suitably etched by using the acid solution without dissolving the resist layer.

By performing the steps above, the semiconductor devices A and B can be obtained. Note that the semiconductor devices obtained in such a manner may be subjected to another step as necessary in order to have a desired device structure. For example, a pre-treatment step before forming each portion, a surface polishing step after forming each portion, a dicing step, a step of mounting onto a lead frame, an assembly step of performing packaging after circuit formation, a wire bonding step, a mold sealing step, and the like can be appropriately adopted.

EXAMPLES

The present invention will be described in more detail with examples and comparative examples below, but the present invention is not limited at all to the examples below.

First Example

Semiconductor device A including $ZnGa_2O_4$ (10 nm)/ IGZO (15 nm) semiconductor layer

Formation of IGZO Layer

A highly conductive n-type silicon substrate in which a thermal oxide film ($SiO_2$) of 200 nm was formed on a silicon wafer equal to or less than n-type specific resistance 0.0017 Ω·cm was prepared. An IGZO layer of 15 nm was formed on the substrate. The IGZO layer was formed by an RF sputtering method by using an IGZO sintered target in which an atomic number concentration of In:Ga:Zn was 2:2:1. Note that a substrate temperature during film formation was 105 degree Celsius, and Ar was used for a sputtering gas. At the same time, oxygen as a reactive gas was introduced at a rate of 10% in a volume ratio to Ar.

Formation of Spinel-Type $ZnGa_2O_4$ Layer

Next, a spinel-type $ZnGa_2O_4$ layer of 10 nm was formed so as to cover the above-mentioned IGZO layer, and the $ZnGa_2O_4$/IGZO semiconductor layer was obtained. The formation of the spinel-type $ZnGa_2O_4$ layer was performed by the same sputtering device as that used for the formation of the IGZO layer by using a $ZnGa_2O_4$ sintered target. Note that it had been found that a suitable temperature for crystallizing $ZnGa_2O_4$ into a spinel-type shape was 190 degree Celsius or more, based on a previous experimental result. Thus, a target output was controlled such that a composition ratio of Zn and Ga was 8:1, and a $ZnGa_2O_4$ layer having a spinel crystalline structure was formed by performing substrate heating at 230 degree Celsius. For a sputtering gas, an Ar gas not containing hydrogen was used. At the same time, oxygen as a reactive gas was introduced at a rate of 10% in a volume ratio to Ar. In this way, control was performed to prevent deficiency of hydrogen and oxygen. Then, film formation was performed under conditions that back pressure was equal to or less than $1×10^{-4}$ Pa and film-formation pressure was 0.22 Pa.

A resist material was applied onto the obtained $ZnGa_2O_4$/ IGZO semiconductor layer, patterning of the resist material was performed by a typical photolithography step, and the semiconductor layer was then etched for approximately 120 seconds by using an etching solution (ITO-07, manufactured by KANTO CHEMICAL Co., Inc.) heated to 40 degree Celsius, thereby performing patterning of the semiconductor layer.

Formation of Source and Drain Electrodes

Then, an Al film (film thickness of 100 nm) to be source and drain electrodes was film-formed by a vacuum evaporation method so as to cover the semiconductor layer. The vacuum evaporation method in this case was performed by using a resistance heating vacuum evaporation device.

Subsequently, a resist material was applied onto the Al film, patterning of the resist material was performed by a typical photolithography step, and the Al film was then immersed in an etching solution (KSMF-100, manufactured by KANTO CHEMICAL Co., Inc.) of 40 degree Celsius for approximately 40 seconds to be etched, thereby forming the source and drain electrodes.

Next, the semiconductor device A having a structure illustrated in FIG. 1 was produced by annealing (annealing oven: thermostatic device with safety door, manufactured by ESPEC Corp.) the semiconductor layer in an atmospheric environment for three hours at 105 degree Celsius.

Figure 6:
FIG. 6 is a graph illustrating a measurement result of a property of the semiconductor device A according to the first embodiment.

For the semiconductor device A, a transfer property was measured by using a semiconductor parameter analyzer (4300A-SCS, manufactured by Keithley Instruments Inc.), and a film thickness was measured by using P16+, manu-factured by KLA-Tencor Corp. The result is illustrated in FIG. 6.

Second Example

Semiconductor device B including $ZnGa_2O_4$ (10 nm)/ IGZTO (10 nm) semiconductor layer

Formation of IGZTO Layer

A highly conductive n-type silicon substrate in which a thermal oxide film ($SiO_2$) of 200 nm was formed on a silicon wafer equal to or less than n-type specific resistance 0.0017 $\Omega \cdot cm$ was prepared. An IGZTO layer of 10 nm was formed on the substrate. The IGZTO layer was formed by an RF sputtering method by using an IGZTO target (KOS-B02, manufactured by Kobelco Research Institute Inc.) and a $ZnGa_2O_4$ sintered target in which an atomic number concentration of Zn:Ga was 8:1. Note that a substrate temperature during film formation was 105 degree Celsius, and Ar was used for a sputtering gas. At the same time, oxygen as a reactive gas was introduced at a rate of 10% in a volume ratio to Ar.

Formation of Spinel-type $ZnGa_2O_4$ Layer

Next, a spinel-type $ZnGa_2O_4$ layer of 10 nm was formed so as to cover the above-mentioned IGZTO layer, and the $ZnGa_2O_4$/IGZTO semiconductor layer was obtained. The formation of the $ZnGa_2O_4$ layer was performed by the same sputtering device as that used for the formation of the IGZO layer by using a $ZnGa_2O_4$ sintered target. A target output was controlled such that a composition ratio of Zn and Ga was 8:1, and a $ZnGa_2O_4$ layer having a spinel crystalline structure was formed by performing substrate heating at 230 degree Celsius. For a sputtering gas, an Ar gas not containing hydrogen was used. At the same time, oxygen as a reactive gas was introduced at a rate of 10% in a volume ratio to Ar. In this way, control was performed to prevent deficiency of hydrogen and oxygen. Then, film formation was performed under conditions that back pressure was equal to or less than $1 \times 10^{-4}$ Pa and film-formation pressure was 0.22 Pa.

A resist material was applied onto the obtained $ZnGa_2O_4$/IGZTO semiconductor layer, patterning of the resist material was performed by a typical photolithography step, and the semiconductor layer was then etched for approximately 3 minutes by using an etching solution (ITO-07, manufactured by KANTO CHEMICAL Co., Inc.) heated to 40 degree Celsius, thereby performing patterning of the semiconductor layer.

Formation of Source and Drain Electrodes

Then, an Mo electrode (film thickness of 100 nm) to be source and drain electrodes was film-formed by a vacuum evaporation method so as to cover the semiconductor layer. The vacuum evaporation method in this case was performed by using a resistance heating vacuum evaporation device.

Subsequently, a resist material was coated onto the Mo film, patterning of the resist material was performed by a typical photolithography step, and the Mo film was then immersed in an etching solution (KSMF-100, manufactured by KANTO CHEMICAL Co., Inc.) heated to 40 degree Celsius for approximately 40 seconds to be etched, thereby forming the source and drain electrodes.

Next, the semiconductor device B having a structure illustrated in FIG. 2 was produced by annealing (annealing oven: thermostatic device with safety door, manufactured by ESPEC Corp.) the semiconductor layer in an atmospheric environment for three hours at 120 degree Celsius.

Figure 7:
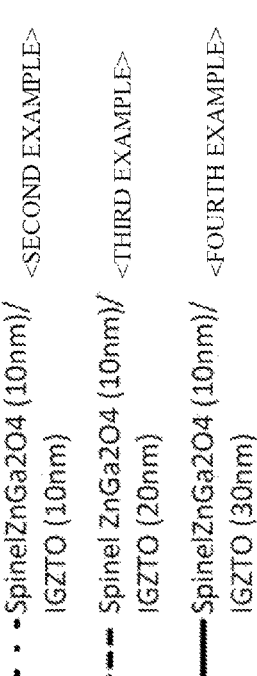
FIG. 7 is a graph illustrating measurement results of a property of semiconductor devices each including a semiconductor layer having a corresponding film thickness to which post-treatment was applied at an annealing temperature of 120 degree Celsius.
Figure 7:
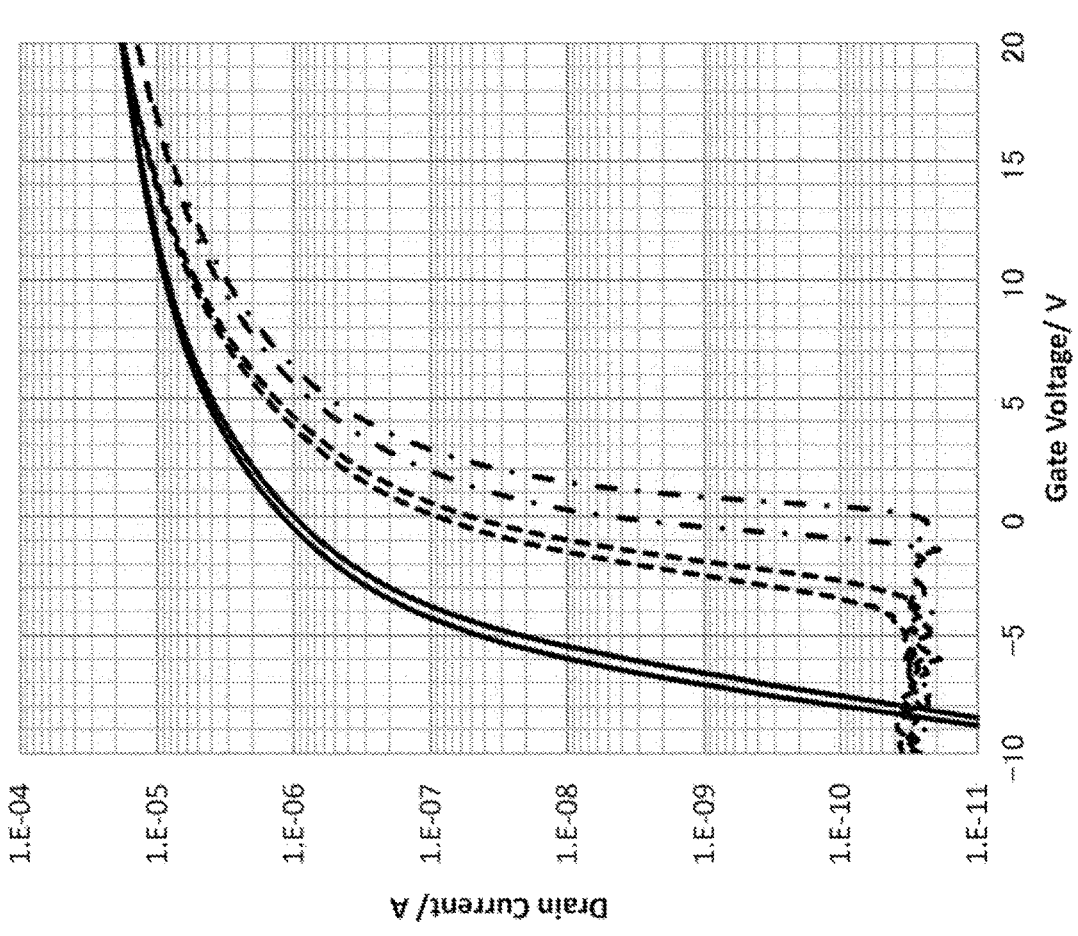

For the semiconductor device B, a transfer property was measured by using a semiconductor parameter analyzer (4300A-SCS, manufactured by Keithley Instruments Inc.), and a film thickness was measured by using P16+, manufactured by KLA-Tencor Corp. The result is illustrated in FIG. 7.

Third to Sixth Examples, First to Third Comparative Examples

Evaluation of semiconductor devices each including a semiconductor layer having different film thickness Semiconductor devices each including a semiconductor layer having different film thickness was produced, and transfer property evaluation was performed. First to third comparative examples did not each include a $ZnGa_2O_4$ layer. The production of the semiconductor devices was performed under conditions similar to those in Second example, except for a semiconductor layer formation condition (film thickness, the presence or absence of the $ZnGa_2O_4$ layer), an etching condition, and post-treatment. A design film thickness was controlled with sputtering time. For the etching condition, one-minute immersion was performed at room temperature. The post-treatment was performed for three hours at an annealing temperature of 120 or 150 degree Celsius. A film thickness was measured by using P16+, manufactured by KLA-Tencor Corp. A transfer property was measured by using a semiconductor parameter analyzer (4300A-SCS, manufactured by Keithley Instruments Inc.). The result is illustrated in FIGS. 7 to 10.

Third Example

Semiconductor layer: Spinel-type $ZnGa_2O_4$ (10 nm)/IGZTO (20 nm)
Annealing temperature: 120 degree Celsius
Measurement result: FIG. 7

Fourth Example

Semiconductor layer: Spinel-type $ZnGa_2O_4$ (10 nm)/IGZTO (30 nm)
Annealing temperature: 120 degree Celsius
Measurement result: FIG. 7

Fifth Example

Figure 8:
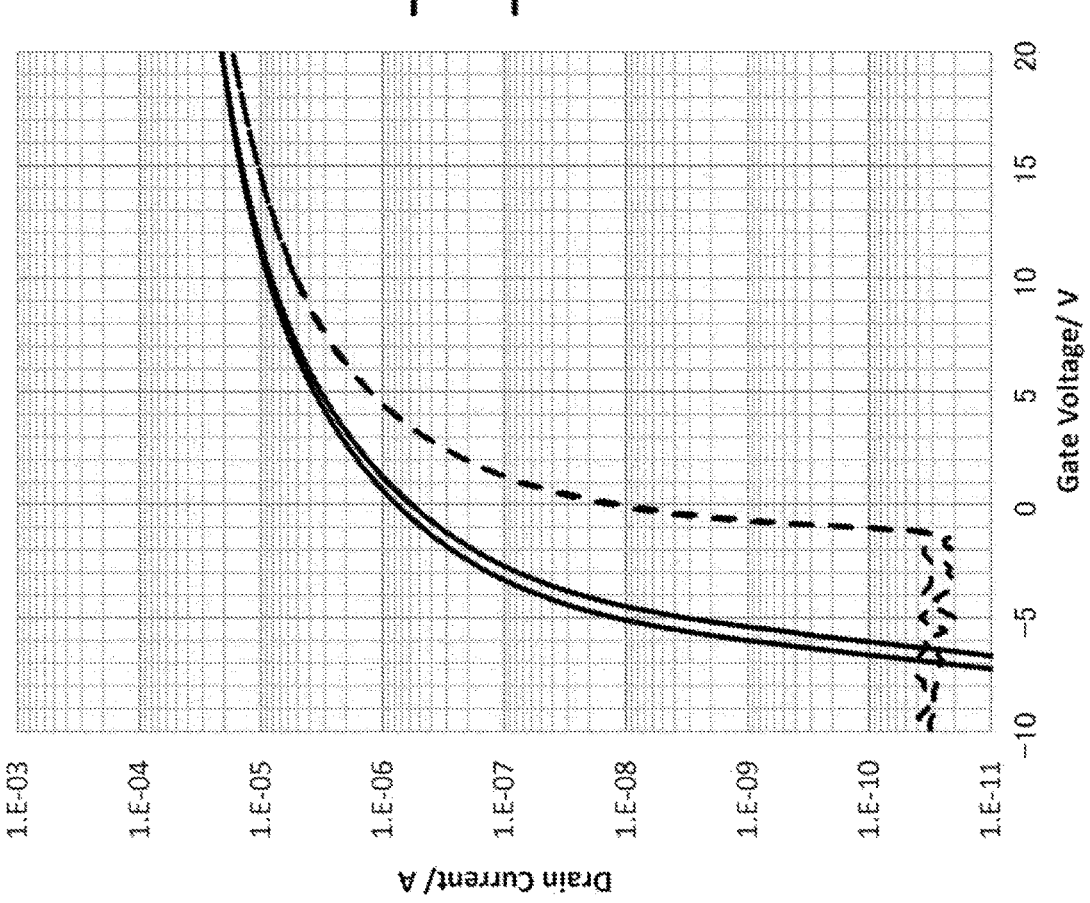
FIG. 8 is a graph illustrating measurement results of a property of semiconductor devices each including a semiconductor layer having a corresponding film thickness to which post-treatment was applied at an annealing temperature of 150 degree Celsius.

Semiconductor layer: Spinel-type $ZnGa_2O_4$ (10 nm)/IGZTO (10 nm)
Annealing temperature: 150 degree Celsius
Measurement result: FIG. 8

Sixth Example

Semiconductor layer: Spinel-type $ZnGa_2O_4$ (10 nm)/IGZTO (20 nm)
Annealing temperature: 150 degree Celsius
Measurement result: FIG. 8

First Comparative Example

Figure 9:
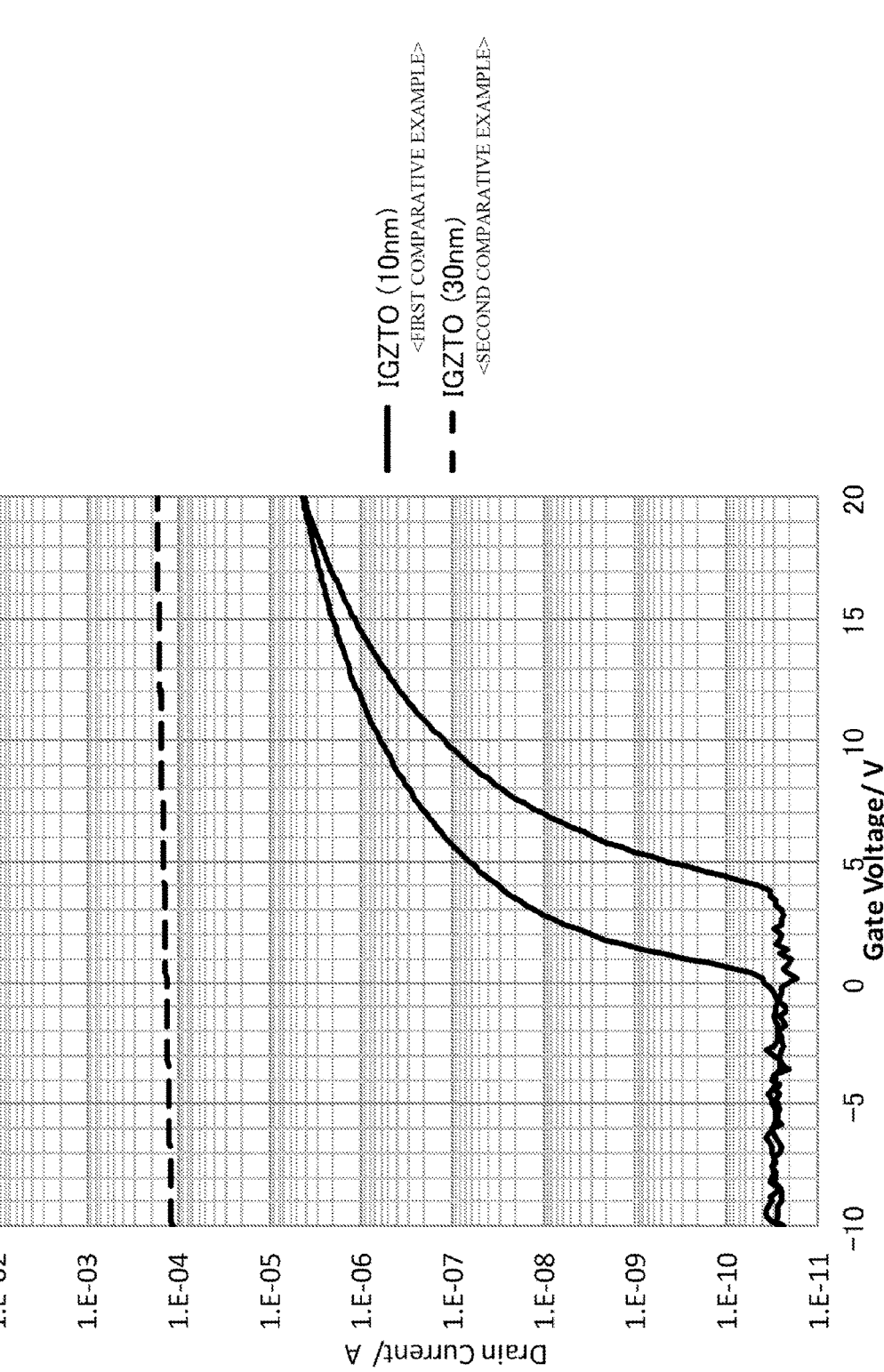
FIG. 9 is a graph illustrating measurement results of a property of semiconductor devices each including an IGZTO semiconductor layer having a corresponding film thickness to which post-treatment was applied at an annealing temperature of 120 degree Celsius.

Semiconductor layer: IGZTO (10 nm)
Annealing temperature: 120 degree Celsius
Measurement result: FIG. 9

Second Comparative Example

Semiconductor layer: IGZTO (30 nm)
Annealing temperature: 120 degree Celsius
Measurement result: FIG. 9

Third Comparative Example

Figure 10:
FIG. 10 is a graph illustrating a measurement result of a property of a semiconductor device including an IGZTO semiconductor layer to which post-treatment was applied at an annealing temperature of 150 degree Celsius.
Figure 10:
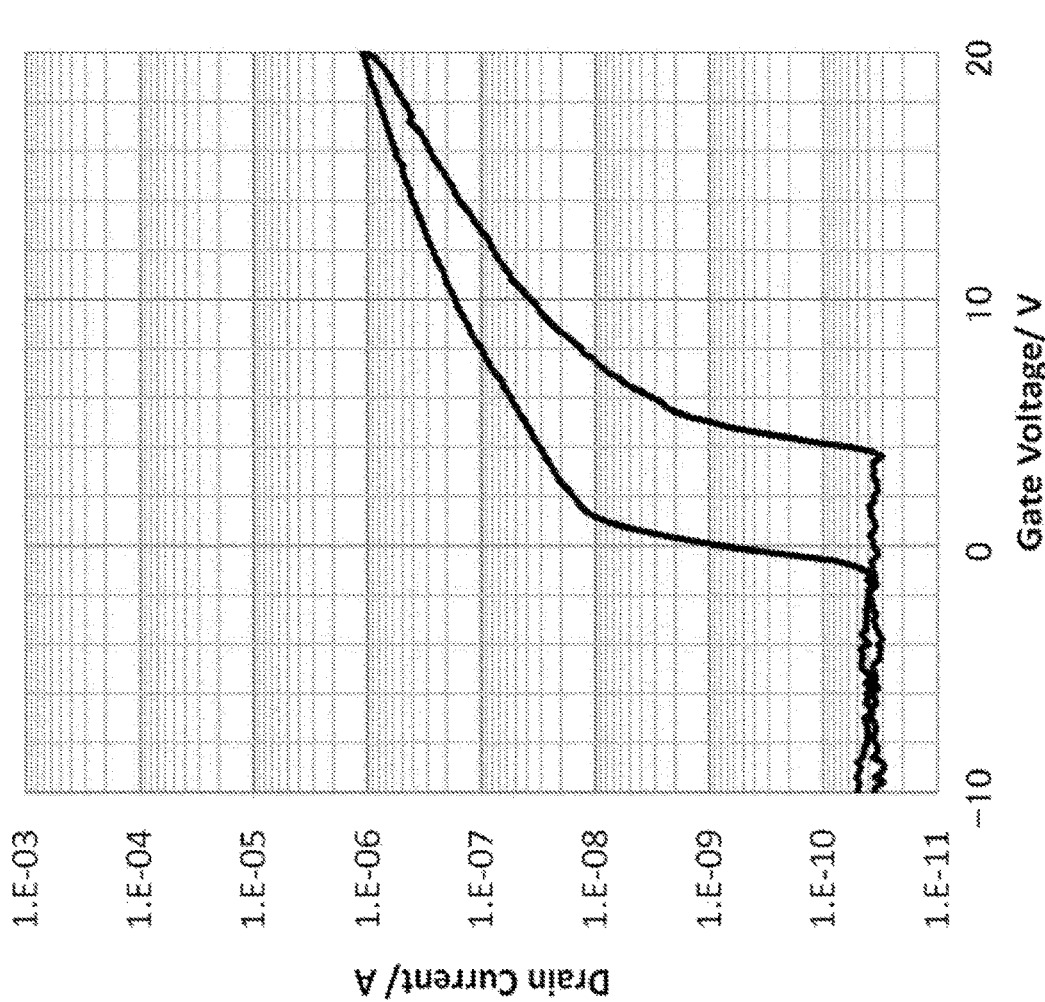

Semiconductor layer: IGZTO (10 nm)
Annealing temperature: 150 degree Celsius
Measurement result: FIG. 10

As illustrated in FIGS. 6 to 8, it is found that the semiconductor devices according to the first to sixth examples can each obtain a satisfactory semiconductor property. On the other hand, as illustrated in FIGS. 9 and 10, it is found that the first and third comparative examples are unsuitable for semiconductor devices because the first and third comparative examples have high hysteresis, and it is found that the second comparative example does not function as a semiconductor device because the second comparative example is electrically connected regardless of voltage applied to the gate electrode.

What is claimed is:

1. A semiconductor device comprising:
a first electrode;
a second electrode; and
a semiconductor layer in contact with the first electrode and the second electrode, wherein
the semiconductor layer includes a first oxide layer of 5 to 20 nm containing spinel-type $ZnGa_2O_4$, and a second oxide layer of 5 to 50 nm containing In, Ga, and Zn.

2. The semiconductor device according to claim 1, wherein
the second oxide layer contains Sn.

3. The semiconductor device according to claim 1, further comprising:
an insulating layer in contact with the semiconductor layer; and
a third electrode provided to face the semiconductor layer via the insulating layer, wherein the semiconductor device constitutes a transistor in which the first electrode, the second electrode, and the third electrode are a source electrode, a drain electrode, and a gate electrode, respectively.

4. The semiconductor device according to claim 1, wherein
the first electrode and the second electrode are on the first oxide layer.

5. An electronic device comprising the semiconductor device according to claim 1.

6. A pH sensor comprising the semiconductor device according to claim 1.

7. A biosensor comprising the semiconductor device according to claim 1.

8. A method for manufacturing a semiconductor device, the semiconductor device being according to claim 1, the method comprising:
forming the semiconductor layer;
forming a conductive layer on the semiconductor layer; and
etching the conductive layer corresponding to a certain pattern to form the first electrode and the second electrode.

9. The method for manufacturing a semiconductor device according to claim 8, wherein
formation of the first oxide layer is performed at 190 degree Celsius or more.

10. A method for manufacturing an electronic device comprising
forming a semiconductor device by using the method for manufacturing a semiconductor device according to claim 8.

* * * * *